United States Patent [19]

Klayman

[11] Patent Number: 4,836,329

[45] Date of Patent: Jun. 6, 1989

[54] LOUDSPEAKER SYSTEM WITH WIDE DISPERSION BAFFLE

[75] Inventor: Arnold I. Klayman, Huntington Beach, Calif.

[73] Assignee: Hughes Aircraft Company, Los Angeles, Calif.

[21] Appl. No.: 76,242

[22] Filed: Jul. 21, 1987

[51] Int. Cl.[4] .......... H05K 5/00

[52] U.S. Cl. .......... 181/155; 181/144; 181/175; 181/199; 381/160

[58] Field of Search .......... 181/143, 144, 152–155, 181/175, 199, 185, 191, 147; 381/90, 91, 160, 158

[56] References Cited

U.S. PATENT DOCUMENTS

| | | | |
|---|---|---|---|
| 538,263 | 4/1895 | Kinney | 181/175 |
| 709,984 | 9/1902 | How | 181/192 |
| 1,786,279 | 12/1930 | Wolff | 181/155 |
| 2,580,916 | 1/1952 | Hodge | 181/144 |
| 2,643,727 | 6/1953 | Leon | 181/155 |
| 2,869,667 | 1/1959 | Leslie | 181/143 |
| 2,993,557 | 7/1961 | Miller et al. | 181/147 |
| 3,477,540 | 11/1969 | Rizo-Patron | 181/144 X |
| 3,816,672 | 6/1974 | Gefyert et al. | 381/158 |
| 4,107,479 | 8/1978 | Heil | 181/155 X |
| 4,134,324 | 1/1979 | Lemert | 84/411 R |
| 4,196,790 | 4/1980 | Reams | 181/145 |
| 4,348,549 | 9/1982 | Berlant | 381/99 |
| 4,580,654 | 4/1986 | Hale | 181/146 |
| 4,620,317 | 10/1986 | Anderson | 381/90 |

FOREIGN PATENT DOCUMENTS

| | | |
|---|---|---|
| 0252337 | 1/1988 | European Pat. Off. . |
| 1133759 | 7/1962 | Fed. Rep. of Germany . |
| 2325603 | 12/1974 | Fed. Rep. of Germany . |
| 802404 | 9/1936 | France . |
| 564296 | 7/1975 | Switzerland . |
| 830745 | 3/1960 | United Kingdom . |
| 1495536 | 12/1977 | United Kingdom . |

*Primary Examiner*—B. R. Fuller
*Attorney, Agent, or Firm*—Joseph E. Szabo; Anthony W. Karambelas

[57] ABSTRACT

A wide dispersion baffle for a vertically oriented loudspeaker includes a first semi-conical reflective section that is concave toward the speaker and has a semicircular rim positioned at the periphery of the speaker. It extends at an angle of about 45° to the radiation axis of the speaker to its apex on the speaker axis. A second semi-conical reflective section is convex toward the speaker and extends from the apex of the first semiconical section at substantially the same 45° angle with respect to the speaker radiation axis. Sound emanating from the vertically directed speaker is reflected by both the concave and convex semi-conical reflector sections in a pattern centered about a substantially horizontal plane, but the sound is reflected through widely diverging angles in such horizontal plane. Baffle arrangements can provide horizonal dispersion patterns of any angular width between about 180° and 360°.

36 Claims, 4 Drawing Sheets

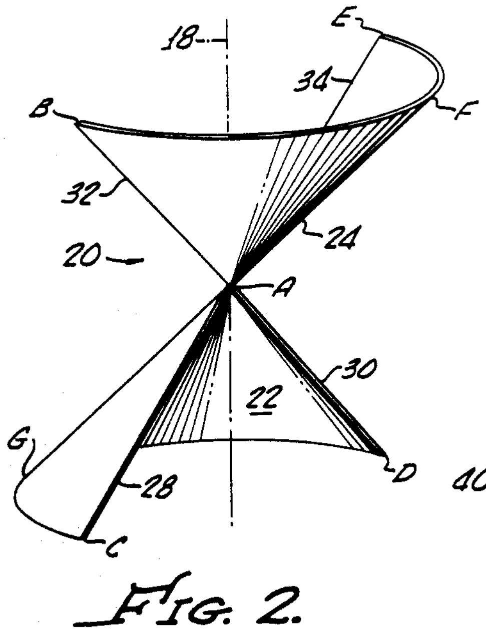
FIG. 2.
FIG. 1.
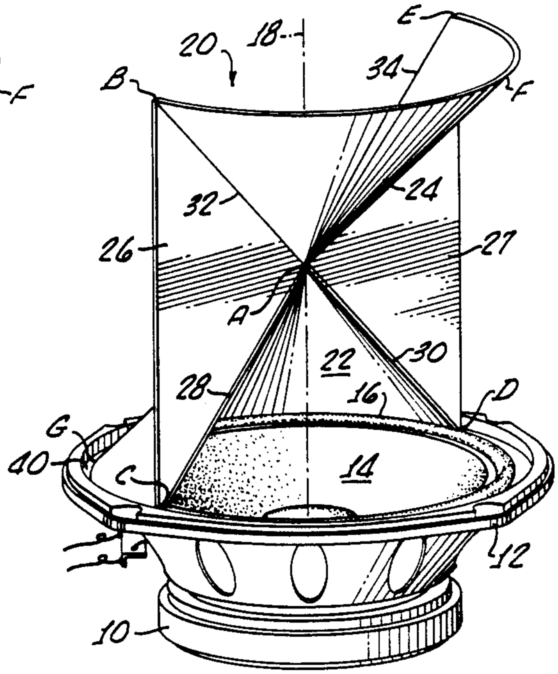
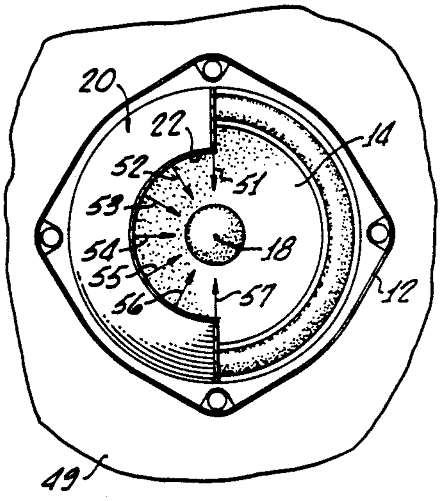
FIG. 5.
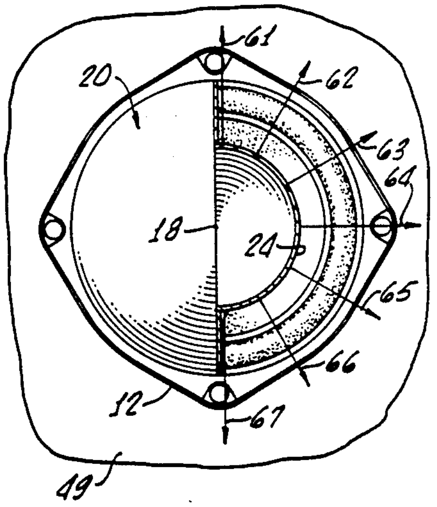
FIG. 6.

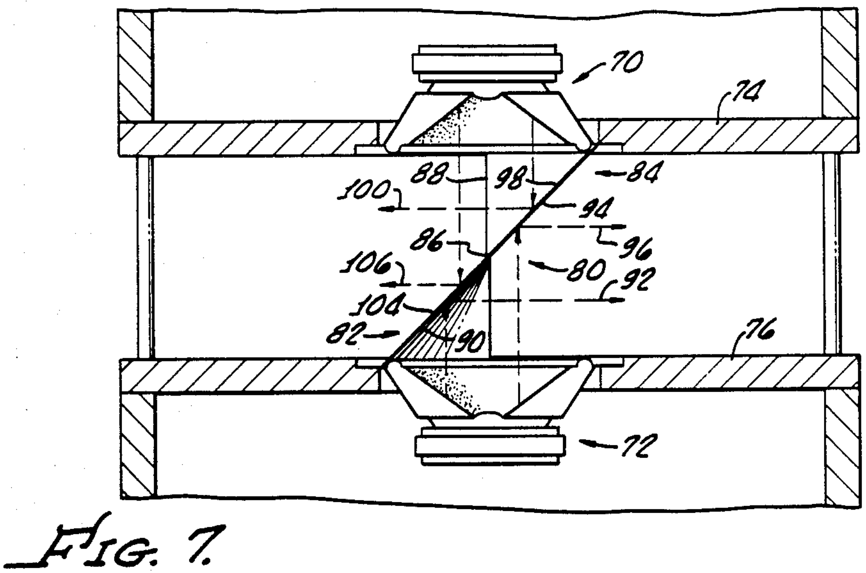
FIG. 7.
FIG. 8.
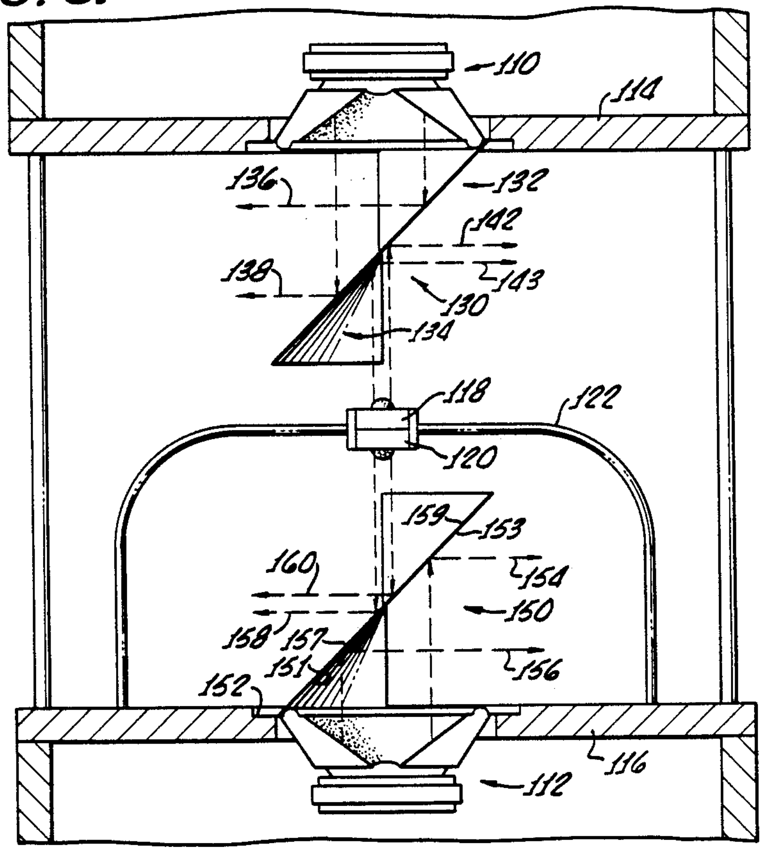

LOUDSPEAKER SYSTEM WITH WIDE DISPERSION BAFFLE

BACKGROUND OF THE INVENTION

1. Field of the Invention

This invention relates to loudspeaker systems and more particularly concerns an efficient speaker system having a wide dispersion pattern.

2. Description of Related Art

Despite widespread attempts over many years to improve electronics of reproduction of sound, none can be completely successful in the absence of satisfactory loudspeaker systems. Thus the intensive effort for development of electronic sound reproducing systems has been paralleled by comparable efforts for developing sound radiation systems, systems that can properly and realistically transduce the electrical signal received from an electronic amplifier into a radiated sound. In many sound radiating or loudspeaker systems it is highly desirable to radiate sound in a wide dispersion pattern. Speakers capable of radiating sound in a narrow dispersion pattern, patterns having a width on the order of 60° or less, are widely available, but dispersion patterns of 120° or more are difficult to attain with known systems. Some speaker systems having a wide dispersion pattern include an array of a number of speakers, each of which individually has a narrow dispersion pattern, but each of which is pointed in a different direction so as to collectively provide the wider pattern. Horns have been employed for providing a wide dispersion pattern, but these are limited either in frequency or by required physical size at certain frequencies.

Bearing in mind the cost, difficulties and other problems in speaker arrays or horn type arrangements, a variety of baffles or sound reflectors have been devised. Some reflective speaker systems are designed to reflect their radiated sound from walls or room corners to attain desired dispersion patterns. Other systems, such as that shown in U.S. Pat. No. 4,348,549, for example, attain a 360° dispersion by directing speaker radiation vertically upwardly against the exterior surface of a conical reflector pointed downwardly toward the speaker and having its apex positioned at or about the plane of the speaker aperture. Such full cone reflectors are inefficient and introduce certain distortions in the form of interference. Because of the position of the full circular cone, a significant portion of the sound radiated by the speaker, which is radiated in an angular, although relatively narrow, pattern, is radiated in directions parallel to or past the reflective surfaces of the cone, and thus a part of the sound radiated by the speaker is projected upwardly toward the room ceiling, where it is lost or poorly or improperly reflected. Further, because of the position of the full circular cone, sound radiated from one side of the speaker in a direction generally parallel to the conical reflector surface may interfere with sound radiated directly vertically upwardly from the other side of the speaker and then reflected horizontally along a path intersecting the path of the direct radiated sound. This may cause interference and thus loss of certain sound components. Further, such conical reflectors provide for only a full 360° dispersion and do not readily lend themselves to selective adjustment of dispersion pattern between angles of from 180° to 360°. Other straight, curved or elliptical reflectors fail to provide dispersion patterns of adequate width.

Accordingly, it is an object of the present invention to provide a speaker system having a wide dispersion pattern of a selected width which avoids or minimizes problems mentioned above.

SUMMARY OF THE INVENTION

In carrying out principles of the present invention, in accordance with a preferred embodiment thereof, a wide angle dispersion speaker system includes a reflector positioned adjacent the speaker for redirecting sound from the speaker in a plurality of directions extending at an angle to the radiation axis of the speaker. The reflector means has a reflective surface including a plurality of reflector elements, each extending across the speaker aperture from a point adjacent an edge of the speaker aperture at an acute angle with respect to the radiation axis. Preferably the reflective surface is defined by motion of a line that extends from a first point adjacent the periphery of the speaker aperture through and beyond a second point on the radiation axis at a distance from the plane of the aperture, such motion of the line being defined by motion of the first point along part of the periphery of the speaker aperture Thus a reflective surface having both concave and convex sections is formed. According to a specific feature of the invention, where a speaker system employs a speaker having a circular aperture, the reflective surface includes a first concave conical reflective surface portion tapering from the plane of the speaker aperture toward an apex displaced from the aperture and a second convex conical reflective surface portion extending from the apex away from the speaker aperture. According to another feature of the invention, the reflector includes a first concave section having an edge substantially coextensive with a section of the periphery of the speaker aperture and having an apex positioned substantially at the apex of a second, but convexly curved, reflective surface which tapers outwardly from its apex away from the speaker.

BRIEF DESCRIPTION OF THE DRAWINGS

In the accompanying drawings:

FIG. 1 is a pictorial illustration of a speaker having a reflector embodying principles of the present invention;

FIG. 2 illustrates a surface of a figure of revolution which defines a reflector having concave and convex semi-conical sections;

Figure 3:
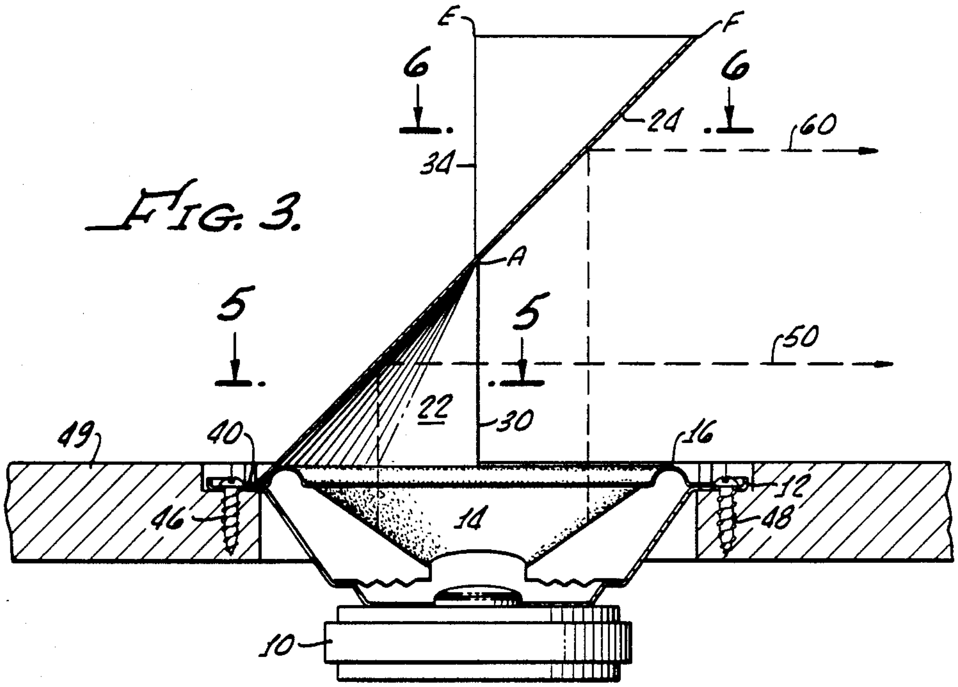
FIG. 3 is a vertical sectional view showing fragments of a speaker panel in which is mounted a speaker having a reflector embodying principles of the present invention.
Figure 9:
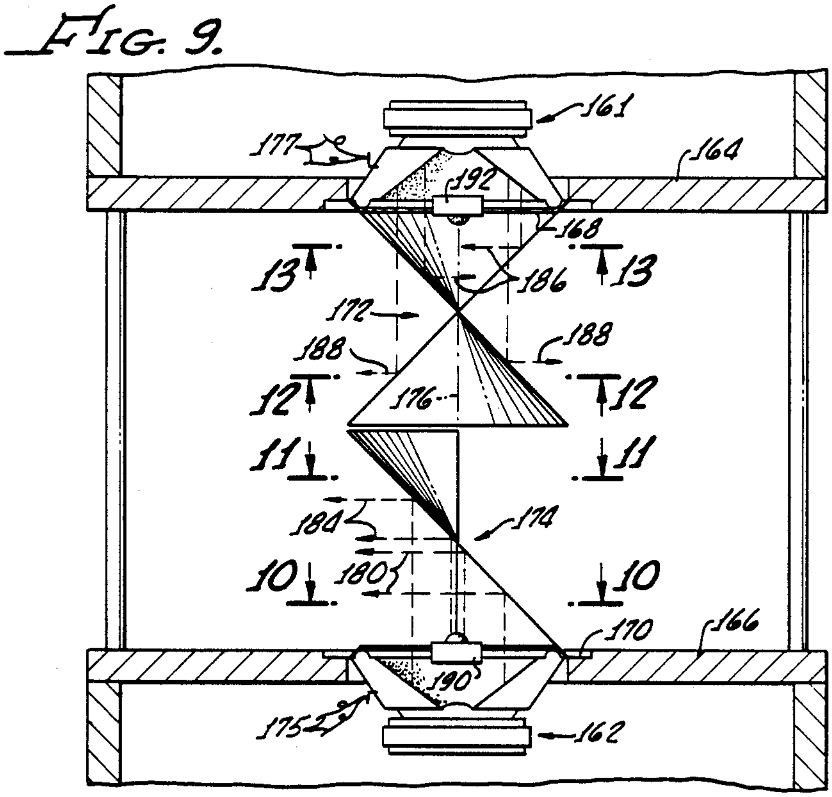

FIG. is a view of the speaker system of FIG. 3 taken in a plane perpendicular to the plane of the view of FIG. 3;

FIGS. 5 and 6 are sections taken on lines 5—5 and 6—6 of FIG. 3;

FIG. 7 shows a modified embodiment of the speaker system of FIGS. 1 through 6;

FIG. 8 shows a still further embodiment;

FIG. 9 shows another embodiment; and

FIGS. 10, 11, 12 and 13 are sections taken on lines 10—10, 11—11, 12—12, and 13—13 respectively of FIG. 9.

DESCRIPTION OF A PREFERRED EMBODIMENT

As illustrated in FIG. 1, a conventional speaker having a magnet 10 and a speaker frame 12 has mounted therein a conical speaker cone element 14 having a continuous circular peripheral edge portion 16 defining an aperture of the speaker. The speaker generally radiates sound along a symmetrically disposed radiation axis indicated at 18. Mounted to the speaker is a concave, convex baffle in the form of a reflector generally indicated at 20, having a concave reflective surface section 22 and a convex reflective surface section 24. The reflector 20 includes flat triangular support plates 26,27 extending vertically.(assuming axis 18 is vertical) between edges of the concave and convex reflector sections 22,24. The reflector and its support plates, as presently preferred, are formed of thin, rigid and smooth surface material, such as a rigid vacuum formed or injection molded plastic.

FIG. 2 illustrates the reflector without its supporting plates 26,27. In general the reflective surface 22,24 is defined by motion of a line, such as the line BAD, where point A intersects the speaker radiation axis 18 and point D lies on or closely adjacent to the periphery 16 of the aperture of speaker cone 14. In a particular example, point B lies on line AD, and both points in B and D are equidistant from point A. The curved reflective surface is defined by that motion of the line BAD which is caused by moving point D along a portion of the periphery 16 of the speaker aperture from point D through point G to point C. While this motion occurs, point A on the line remains substantially on the radiation axis 18, and, accordingly, point B of the line will trace the arc BFE, which is opposite to but congruent with the arc DGC traced by the line end D. Where the speaker cone is circular and its aperture periphery 16 is circular, as illustrated in FIGS. 1 and 2, arcs BFE and DGC are semicircles, or at least circular arcs. Preferably these arcs subtend an angle of 180°, but reflector surfaces somewhat greater or less than 180° may also be employed. Although circular speaker cones are presently preferred for use with the present invention, thus employing reflector surfaces which are semiconical concave and convex surfaces, as illustrated at 22 and 24, it will be readily appreciated that principles of the invention may be applied to speakers having apertures of noncircular configurations, such as, for example, elliptical speakers. In such a case, the described motion of the line BAD, retaining point A on the radiation axis 18 and moving point D along a portion of the elliptical aperture of the now elliptical speaker, would still result in a pair of concave and convex reflector sections, but neither would be semi-conical.

Figure 4:
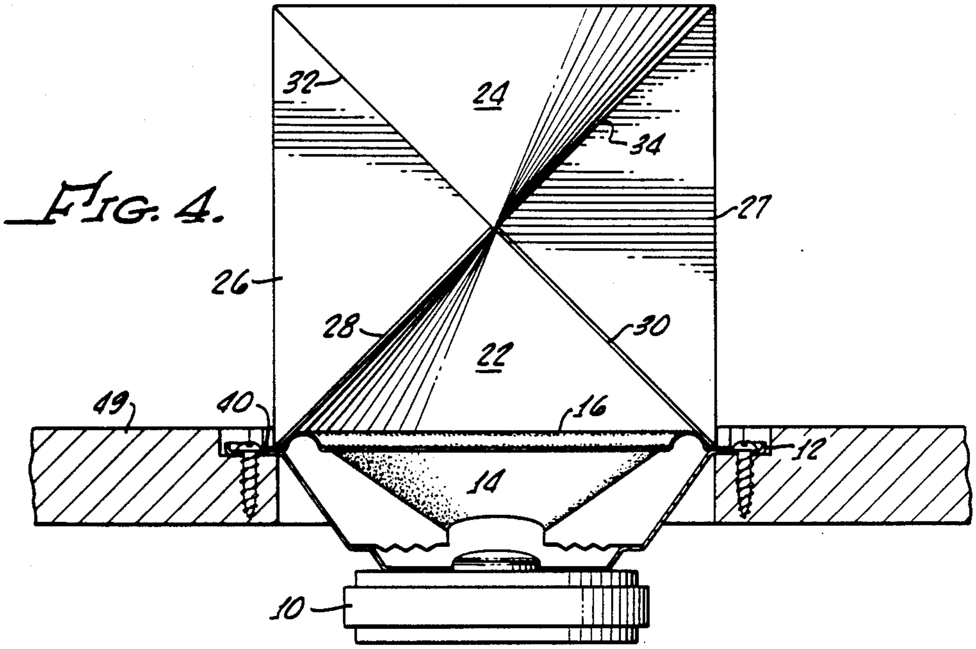

The reflector, having a surface defined by the above-stated motion of the line BAD, has edges 28,30 on the concave section 22 and edges 32,34 on the convex section 24. In the system illustrated in FIG. 1, where the upwardly facing speaker aperture is circular and thus the reflective sections are both semi-conical sections, the described motion of point D of line BAD in defining the curved reflective surfaces 22,24 occurs over one half of the periphery 16 of the speaker cone. That is, point D moves through a semicircle of 180°. In such an embodiment, edges 28,30 lie in a vertical plane containing the vertical radiation axis 18, and similarly edges 32,34 of the convex section 24 lie in the very same plane. It is to these edges, 32,28 on the one hand and 34,30 on the other, that the support plates 26 and 27 respectively are secured, thus fixedly and rigidly connecting and supporting the convex section 24 to the concave section 22. Concave section 22 is provided with a peripheral flange 40 that overlies and is secured to a section of the peripheral flange 12 (see FIGS. 3 and 4) of the speaker frame. As can be seen in FIGS. 3 and 4, the speaker frame is secured by means of its flanges and fastening devices such as screws 46,48 to the edges of a hole in a speaker mounting panel 49, of which only a section is illustrated in FIGS. 3 and 4.

The combination of concave and convex reflective surfaces of the reflector 20, when used with a speaker having a circular aperture, may also be described as a surface of revolution defined by rotation of a line, such as line BAD of FIG. 2 about the vertical axis 18. Such a line, when rotating about the vertical axis 18, will sweep two conical surfaces, the semi-conical concave reflective surface 22 and the semi-conical convex reflective surface 24. Preferably the angle of the cone, that is, the angle between an element of the cone such as an element along the line BAD and the conical or radiation axis 18, is 45° or less. Thus each element of the reflective surfaces 22,24 must make an angle with the plane of the speaker aperture (a horizontal plane in an upwardly directed speaker) that is not less than about 45°. If such an angle of the reflective surface with respect to a horizontal plane is less than 45°, sound radiated from the speaker is reflected in a direction having a downwardly pointed component (toward the plane of the speaker aperture), which is undesirable. If the angle between the reflective surface and the horizontal plane is somewhat greater than 45°, sound will be reflected with a slightly upwardly directed component, which is preferable to a downwardly directed component. Of course where the speaker is mounted so that its radiation axis is somewhat tilted to the vertical, the angle of the reflective surface with respect to the radiation axis will vary so as to direct the reflected sound in a plane extending in the desired direction, but preferably not toward the plane of the speaker aperture.

Assuming the radiation axis 18 of the speaker to be vertical, and the reflective surfaces 22,24 to have all of their elements extending at an angle of 45° with respect to a horizontal plane, sound radiated from the speaker cone 14 is radiated and reflected as indicated by the arrows shown in FIGS. 3, 5 and 6. Thus dotted direction line 50 of FIG. 3 indicates that sound radiated from one portion of speaker cone 14 is reflected from the concave reflective surface 22 in the horizontal direction of line 50, and sound radiated from another portion of the speaker cone is reflected from the convex surface 24 along a horizontal direction line 60. Therefore, vertically radiated sound of the speaker, which is reflected from the reflector, is projected from the reflective surface along and in substantially horizontal planes. More specifically it is projected in a pattern centered vertically on a substantially horizontal plane. Importantly, as can be seen in the sectional views of FIGS. 5 and 6, the sound is widely dispersed (in azimuth) within such horizontal planes.

Thus FIGS. 5 and 6 illustrate the capability of the described reflector to provide wide dispersion from the upper, or convex, reflector section, while still collecting and reflecting sound by the concave reflector section. For example, the section illustrated in FIG. 5 shows by arrows 51,52,53,54,55,56 and 57 reflection of vertically radiated sound from concave section 22 in a plurality of different directions all in a substantially horizontal plane, and all pointed toward the speaker radiation axis 18. As can be seen in FIG. 6, on the other hand, vertically directed sound reflected from the convex section 24 is reflected in the directions indicated by lines 61,62,63,64,65,66 and 67, which are all directed radially outwardly of the speaker radiation axis 18 and thus provide a pattern of dispersion of a full 180° in the horizontal direction. Effectively the reflector is composed of a number of reflective elements that collectively define the reflector surface. Each element has a sound reflecting surface positioned in a plane that extends at a respective, different angle relative to a reference plane containing the radiation axis. Each element has a first section (on one side of the cone apex) that cooperates with other elements on that side to define the concave reflective surface. Each element also has a second section (on the other side of the cone apex) that cooperates with other elements on such other side of the apex to define the convex reflector surface. Each element, when projected on a plane perpendicular to the radiation axis, extends at a different angle to the radiation axis.

The described system employs a reflector that is a pure reflector and has a flat response for all frequencies. The embodiment described to this point provides a radiation dispersion pattern of 180°. As will be understood as the description proceeds, and as illustrated in connection with FIGS. 7, 8 and 9, principles of the invention can be applied to speaker systems which provide dispersion patterns of greater than 180°, and in fact of any width between 180° and 360°.

Illustrated in FIG. 7 is a speaker arrangement, with reflectors incorporating principles of the present invention, that is set up to provide a full 360° sound dispersion pattern. In this arrangement first and second mutually opposed and vertically oriented upper and lower speakers 70 and 72 are mounted in a speaker enclosure having speaker panels 74 and 76 which are fixedly connected to one another so that the speakers are mounted in direct alignment with one another, each radiating its sound vertically. Upper speaker 70 radiates its sound vertically downwardly, and lower speaker 72 radiates its sound vertically upwardly. A reflector 80, which may be identical to the reflector 20 illustrated in FIGS. 1 through 6, includes a first semi-conical section 82 and a second semi-conical section 84. The two are joined to one another at their common apex, an intermediate point 86, on the common radiation axis 88 of both speakers. Reflector section 82 is a semi-conical section that is equivalent to, and in fact may be identical to, section 22 shown in FIG. 1. Similarly section 84 may be equivalent or identical to speaker reflector section 24 of FIG. 1. The two sections may be connected together by flat plates in the manner of the plates 26,28 of FIG. 1. The sections 82,84 respectively have flanges by which both sections are secured to the mounting flanges of the respective speakers in the same manner that reflector 20 is secured to speaker frame 12 by reflector flange 40.

Since the reflector is made of rigid, thin material and is smooth on both sides, both sides of both speaker sections 82 and 84 are operable in this system. Thus, with respect to speaker 72, reflector section 82 provides a concave reflector surface 90 that reflects vertically upwardly directed sound in horizontal directions 92, and a convex reflective surface 94 that reflects vertically upwardly directed sound from speaker 72 in horizontal directions 96. Thus the speaker 72 and the reflector 80 provide a 180° dispersion pattern, in the same manner as is shown in FIGS. 1, 3, 5 and 6.

With respect to upper speaker 70, upper reflective section 84 provides a conical reflective surface 98 (on the side of reflector section 84 opposite reflective surface 94) that reflects vertically downwardly directed sound in horizontal directions 100, which are opposite to the directions indicated by line 96 for reflection of sound from speaker 72. Similarly, reflector section 82 provides a convex reflective surface 104 for vertically downwardly directed sound from speaker 70 to be reflected in horizontal directions indicated by line 106, which is directly opposite to the direction indicated by line 92. Thus the same reflector 80 that reflects sound from the lower speaker 72 employs its opposite surfaces as a combination of concave and convex reflective surfaces for dispersion of sound from upper speaker 70. Collectively the two speakers 70 and 72 provide a dispersion of sound from the single common reflector 80 through a full 360° pattern, the sound from speaker 70 being dispersed through a first half of a full circle, and the sound from speaker 72 being dispersed through the other half of the same full circle.

As shown in FIG. 8, the 360° dispersion system of FIG. 7 may be modified to include a pair of small high frequency speakers so that the system will include a pair of low range speakers 110,112, mounted respectively in speaker panels 114,116 that are fixedly connected to one another in a single unitary speaker enclosure, the two speakers being mutually aligned and vertically directed downwardly and upwardly just as in the arrangement of FIG. 7. Two of small size high frequency speakers 118,120 are mounted together in opposed relation by means of a structural spider or equivalent support structure 122, with the two high frequency speakers being mutually aligned with the common radiation axes of the lower frequency speakers 110,112, and having their radiation axes directed respectively upwardly and downwardly. A first reflector 130, having a first semi-circular conical section 132 and a second semi-conical reflector section 134, is mounted to the rim of upper speaker 110 by a suitable mounting flange. Reflector 130 may be identical to the combined convex, concave reflectors illustrated in FIGS. 1 and 7, with the upper surface of this reflector redirecting sound projected vertically downwardly from upper speaker 110 in horizontal directions indicated at 136,138. The other side of this same reflector operates to redirect vertically upwardly directed sound from high frequency speaker 118 and project such sound in horizontal directions indicated at 142,143. Similarly, a reflector 150, identical to reflector 130, has its lower conical circular edge fixed to a peripheral flange 152 of the lower speaker 112, and extends upwardly toward the downwardly directed high frequency speaker 120 to provide a concave reflective surface that redirects vertically upwardly directed sound from speaker 112 in horizontal directions indicated at 154,156. The surface of reflector 150, which faces toward the right as viewed in FIG. 8, provides a concave semiconical section having a concave surface 151 for reflection of sound from speaker 112 and having a convex surface 153 for reflection of sound from speaker 112. The opposite sides of this same reflector 150 provide a reflective surface 157 that is convex toward the left for reflecting sound radiated vertically downwardly from high frequency speaker 120 to be projected in horizontal directions indicated by line 158. This other surface of the reflector 150 also provides a concave reflective surface 159 that receives vertically downwardly directed sound radiated from high frequency speaker 120 to be redirected along horizontal directions indicated at 160. Thus the upper reflector 130 directs sound from upper speaker 110 in a 180° dispersion pattern projected toward the left and also directs sound from the upper high frequency speaker 118 in a 180° pattern directed toward the right. In a similar manner the lower reflector 150 directs sound from lower speaker 112 in a 180° pattern directed toward the right and reflects sound from the second high frequency speaker 120 in a 180° pattern directed toward the left. The arrangement therefore provides a 360° pattern of sound projected from both low and high frequency speakers.

Figure 10:
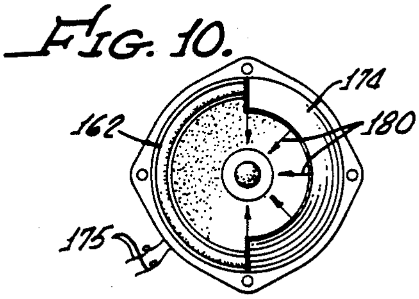
Figure 12:
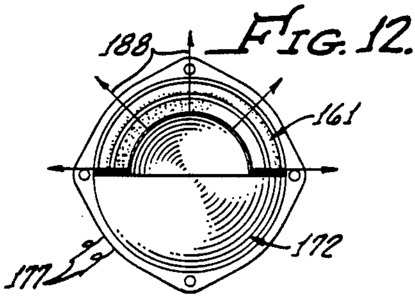
Figure 11:
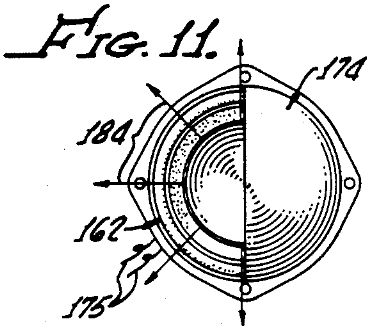

From the description set forth above it will be readily appreciated that by selective choice of relative orientations (about the cone and speaker radiation axes) of a pair of reflectors of the type described herein, each mounted upon a respective one of a pair of speakers, the total pattern of sound dispersion may be chosen to provide any angle between the 180° arrangements of individual speakers and individual cones, shown in FIGS. 1–6, and the 360° pattern of two or more speakers with one or more cones, as shown in FIGS. 7 and 8. Moreover, merely by varying relative orientations of a pair of axially aligned reflectors, a pattern may be selected to cover any angle between 180° and 360°. For example, to obtain a 270° wide dispersion pattern as illustrated in FIG. 9, upper and lower speakers 161,162, mounted on panels 164,166 respectively, are fixedly connected to one another in a unitary speaker enclosure. Each has secured to a portion of its peripheral flange 168,170, respectively, a reflector 172,174 of the type described above and illustrated in FIGS. 1 and 8 for example. The two speakers are mutually aligned and have a common radiation axis indicated at 176. The two reflectors 172,174 are rotated through 90° relative to one another about the common radiation and reflector cone axis 176. This 90° relative orientation is best seen by comparing the sections of FIGS. 10 and 11 with the sections of FIGS. 12 and 13. In FIGS. 10–12 speaker connection wires 175,177 are shown to indicate a point of common orientation for all sections.

FIGS. 10 and 11 are sections taken through the lower conical reflector 174, showing in FIG. 10 the reflection of sound from speaker 162 from the semi-conical reflector surface of reflector 174 in directions indicated by arrows, such as arrows 180, and the reflection of sound from the convex surface of reflector 174 in the widely dispersed directions indicated by arrows 184. Thus the reflector 174 redirects sound radiated vertically upwardly by speaker 162 in horizontal directions generally directed toward the left in FIGS. 10 and 11.

Figure 13:
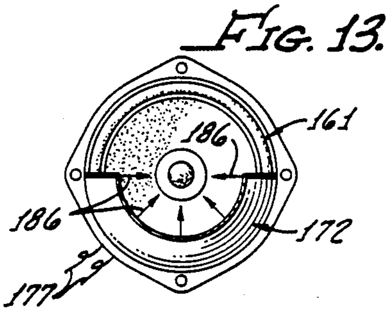

FIGS. 12 and 13 show sections of the upper reflector 172, with FIG. 13 indicating by arrows 186 reflection of vertically downwardly radiated sound of speaker 161 from the concave reflecting surface of reflector 172. Similarly FIG. 12 indicates the direction of sound radiated vertically downwardly from speaker 161 and reflected in horizontal directions indicated at 188 from the convex section of this reflector. The sections of all of FIGS. 10, 11, 12 and 13 are shown in the same relative orientation with respect to one another, speaker orientation being indicated by connection wires 175,177. Thus it can be seen that the lower reflector 174, having sound reflection directions toward the left as seen in FIGS. 10 and 11, provides 180° wide dispersion of sound from speaker 162 in a pattern that is centered along a line extending directly to the left in FIGS. 9, 10 and 11. With respect to FIGS. 12 and 13, it will be seen that the upper reflector 172, being angularly displaced about common radiation axis 176 through 90° relative to lower reflector 174, reflects sound radiated vertically downwardly from speaker 161 in generally horizontal directions indicated by arrows 186,188 which are centered along an axis extending upwardly in the plane of the paper as viewed in FIGS. 12 and 13. As viewed in FIG. 9, sound radiated vertically downwardly from speaker 160 is reflected in a horizontal plane in a pattern centered generally along a line extending perpendicular to the plane of the paper as viewed in FIG. 9. Thus, referring again to FIGS. 10 through 13, the lower reflector 174 provides a 180° pattern centered on a line toward the left as viewed in these figures, whereas the upper reflector 172 provides a redirection of sound in a 180° pattern centered on a generally upwardly directed direction as viewed in FIGS. 12 and 13, providing a net pattern width of 270°, with the sound being reinforced in the common 90° sector by which the two 180° patterns of FIGS. 10 and 11 on the one hand and FIGS. 12 and 13 on the other overlap.

Also shown in the arrangement of FIG. 9 is the mounting of a high frequency speaker or tweeter 190,192 to the speakers 161,162 being suspended symmetrically in the cone of speakers and lying substantially in the plane of the respective speaker aperture. The same concave and convex surfaces of reflector 174, which reflect the vertically radiated sound from low frequency speakers 161,162 in 180° patterns operate to reflect sound that is radiated vertically from the tweeters 190,192 and reflect this sound in 180° patterns that are oriented just the same as the 180° patterns of sound reflected from the larger speakers.

The reflectors of the several embodiments of FIGS. 7, 8 and 9 each includes semi-conical concave and convex sections fixedly secured to each other by support plates corresponding to support plates 26,27 of FIGS. 1–6. Such support plates are intended only to be illustrative of many different ways of physically connecting the two sections to each other or for fixedly mounting them in the described positions and relations without necessarily connecting one section to the other.

What is claimed is:

1. A wide angle dispersion speaker system comprising:

a speaker having a sound radiating element defining a speaker aperture having a plane, said sound radiating element having a circular periphery of a first diameter and having a radiation axis normal to said plane along which axis sound is projected from the sound radiating element, and reflector means connected to the speaker of redirecting sound from the speaker in a plurality of directions extending at an angle to said radiation axis, said reflector means comprising a reflective surface having a convex section spaced from the speaker aperture and a concave section extending substantially from the speaker aperture to said convex section, said concave section having an inner edge extending along part of a circle having a diameter not less than said first diameter.

2. The system of claim 1 wherein each said reflective surface section has a plurality of reflective surface elements each extending across said speaker aperture from a point adjacent an edge of said speaker aperture at an acute angle with respect to the plane of said speaker aperture, each element of a group of said elements having a sound reflecting surface positioned in a plane that extends at a respectively different angle relative to a reference plane containing said radiation axis, whereby each element of said group will reflect sound in a different direction in planes parallel to the plane of said aperture.

3. The system of claim 2 wherein each of a group of said reflector elements of said reflective surface includes a line intersecting said radiation axis and intersecting a point adjacent an edge of said speaker aperture, and wherein said reflective surface is defined by a plurality of adjacent ones of said lines that intersect the plane of said aperture at a plurality of points extending around less then all of the circumference of said aperture.

4. The system of claim 3 wherein each of said lines intersects said radiation axis within a short length of said radiation axis.

5. The system of claim 4 wherein each of said reflector elements extends in a straight line from said speaker aperture edge toward said radiation axis and for a distance beyond said radiation axis.

6. The system of claim 5 wherein said distance for each said reflector element is substantially equal to the length of the same reflector element between said aperture edge and the radiation axis.

7. The system of claim 1 wherein said concave section includes a conical surface portion having an apex displaced from the plane of said aperture and having a semicircular end portion positioned at a portion of said speaker aperture.

8. The system of claim 2 wherein said acute angles of all of the elements of said group are the same.

9. The system of claim 1 wherein said concave section comprises a conical surface portion tapering from the plane of said speaker aperture toward an apex displaced from said aperture.

10. The system of claim 9 wherein said convex section comprises a conical surface portion extending from said apex away from said speaker aperture.

11. The system of claim 1 wherein said convex and concave sections comprise first and second semi-conical surfaces having a common axis aligned with said radiating axis and having mutually adjacent apiece, said first semi-conical surface extending from the apex thereof away from the speaker aperture, and said second semi-conical surface extending from the apex thereof toward the speaker aperture.

12. The system of claim 11 wherein said second semi-conical surface has a semicircular edge positioned at a portion of the edge of said speaker aperture.

13. A wide angle dispersion speaker system comprising:

a speaker having a sound radiating element defining a speaker aperture having a plane, said sound radiating element having a radiation axis normal to said plane along which axis sound is projected from the sound radiating element, and reflector means connected to the speaker for redirecting sound from the speaker in a plurality of directions extending at an angle to said radiation axis, said reflector means comprising a reflective surface having a convex section spaced from the speaker aperture and a concave section extending between the speaker aperture and said convex section, and, a second speaker having a speaker aperture lying in . plane spaced from said first mentioned aperture and having a radiation axis aligned with said first mentioned radiation axis, said reflective surface concave section being spaced from said second speaker aperture and said reflective surface convex section extending between the second speaker and said concave section.

14. The system of claim 13 wherein said concave section includes a mounting flange connected to said first speaker and wherein said convex section includes a mounting flange connected to said second speaker.

15. A wide angle dispersion speaker system comprising:

a speaker having a sound radiating element defining a speaker aperture having a plane, said sound radiating element having a radiation axis normal to said plane along which axis sound is projected from the sound radiating element, reflector means connected to the speaker for redirecting sound from the speaker in a plurality of directions extending at an angle to said radiation axis, said reflector means comprising a reflective surface having a convex section spaced from the speaker aperture and a concave section extending between the speaker aperture and said convex section, and a second speaker having a speaker having a speaker aperture spaced from said first mentioned speaker aperture and having a second radiation axis aligned with said first mentioned radiation axis, second reflector means connected to the second speaker for redirecting sound from the second speaker in a plurality of directions extending at an angle to said second radiation axis, said second reflector means comprising a reflective surface having a second convex section spaced from the second speaker aperture and a second concave section extending between the second speaker aperture and said second convex section.

16. The system of claim 15 wherein said first and second reflector means are angularly oriented relative to one another about the radiation axes of said speakers.

17. The wide angle dispersion speaker system of claim 15 wherein said first mentioned reflector means provides a dispersion pattern having a first pattern axis extending in a first direction in a plane substantially parallel to said first mentioned speaker aperture, and wherein said second reflector means provides a radiation pattern having a second pattern axis extending at an angle with respect to said first pattern axis that is between about 180° and 360°.

18. The system of claim 13 wherein said first mentioned speaker is a relatively low frequency speaker, and wherein said second speaker is a relatively high frequency speaker, whereby sound from said low frequency speaker is reflected from one side of said reflector means and sound radiated from the high frequency speaker is radiated from the other side of said reflector means.

19. The system of claim 13 wherein said second speaker is a high frequency speaker and is mounted between said first mentioned speaker and said reflector means.

20. A loudspeaker reflector comprising:

a reflector body adapted to be mounted adjacent a loudspeaker, said body comprising:

a concave section having a conical concave reflective surface conically tapering in a first direction toward a smaller concave end, a convex section having a conical convex reflective surface conically tapering in a second direction opposite said first direction toward a smaller convex end, and means for connecting said sections to each other with said ends adjacent one another to provide a reflector having both concave and convex conical reflective surfaces.

21. The reflector of claim 20 wherein said reflective surfaces are each figures of revolution having juxtaposed ends.

22. The reflector of claim 20 wherein said concave and convex reflective surfaces are oppositely directed semi-conical surfaces having a common apex.

23. The reflector of claim 20 wherein said reflective surfaces are parts of the surface of a figure of revolution defined by partial rotation about an axis of a line intersecting the axis and extending at an acute angle relative to the axis.

24. A wide angle dispersion speaker system comprising:

a speaker having a sound radiating element defining a speaker aperture having a plane and a periphery, said sound radiating element having a radiation axis normal to said plane, along which axis sound is projected from the sound radiating element, and reflector means positioned adjacent the speaker for redirecting sound from the speaker in a plurality of directions which, when projected on a plane perpendicular to said radiation axis, extend at different angles to said radiation axis, said reflector means comprising a reflective surface defined by a path that would be swept by a straight line that extends from a first point adjacent the periphery of said aperture through and beyond a fixed point on said radiation axis at a distance from the plane of said aperture if said first point were moved along finite path adjacent a portion of said periphery.

25. The system of claim 24 wherein adjacent portions of said reflector means have sound reflecting surfaces positioned in planes that extend at respectively different angles relative to a reference plane containing said radiation axis, whereby said adjacent portions will reflect sound in different directions in planes parallel to the plane of said aperture.

26. The system of claim 24 wherein said speaker aperture is circular and wherein said motion is a rotation of said line about said radiation axis along a circle having a diameter not less than the diameter of said speaker aperture.

27. The system of claim 24 wherein said speaker aperture is circular and said reflective surface comprises a first partial conical surface between said fixed point and the plane of said aperture having an inner edge at said speaker aperture and having an apex at said fixed point, and a second partial conical surface having an apex at said fixed point and extending away from said first conical surface.

28. The system of claim 24 wherein said reflective surface includes a concave portion extending from said periphery to said fixed point and a convex portion extending beyond said fixed point.

29. A speaker system comprising:

a speaker having a sound radiating element for projecting sound in a pattern directed along an axis of said sound radiating element, and reflector means connected with the speaker for redirecting sound projected from the speaker in a dispersion pattern directed at an angle to said speaker radiation axis, said reflector means comprising a baffle having a reflective surface forming part of a figure of revolution, said figure defined by partially rotating about said radiation axis a straight line intersecting said radiation axis and a point adjacent an edge of the sound radiating element, said reflective surface extending from an area adjacent said edge at an acute angle with respect to said radiation axis.

30. The system of claim 29 wherein said baffle includes concave and convex reflective sections positioned adjacent one another at different portions of said radiation axis.

31. The system of claim 30 wherein said concave reflective section has an end portion positioned at and extending along part of an edge of said sound radiating element.

32. The system of claim 29 wherein said baffle includes semi-conical concave and convex sections having common apices and a common axis aligned with said radiation axis, said concave section having an end portion extending along a length of said sound radiating element.

33. The system of claim 29 wherein said reflective surface is defined by a figure of revolution defined by rotating said line about said radiation axis through an angle of not more than about 180°.

34. A reflector for a loudspeaker for redirecting sound from the speaker in a wide dispersion pattern comprising:

a first semi-conical reflector member having an interior surface, having an apex, and having a cone axis extending through said apex, said reflector member having first and second cone element edges spaced from each other about said surface, a second semi-conical reflector member having an exterior surface, having a second apex, and having a second cone axis extending through said second apex, said second reflector member having third and fourth cone element edges spaced from each other about said exterior surface and means for securing said reflector members to each other with said apiece of said reflector members being closely adjacent to one another and said edges all lying in a common plane.

35. A loudspeaker system comprising:

a speaker frame having a periphery a sound radiating element having a periphery mounted to the frame for projecting sound in a direction along an axis of said radiating element, a reflector for redirecting sound from the speaker in a wide dispersion pattern comprising a first semi-conical reflector member having an interior surface extending to the periphery of said sound radiating element, having an apex, and having a cone axis extending through said apex, said reflector member having first and second cone element edges spaced from each other about said surface, a second semi-conical reflector member having an exterior surface, having a second apex, and having a second cone axis extending through said second apex, said second reflector member having third and fourth cone element edges spaced from each other about said exterior surface, and means for securing said reflector members to each other with said apiece of said reflector members being closely adjacent to one another and said edges all lying in a common plane, and means for connecting said reflector to said speaker frame.

36. A loudspeaker system comprising:

a speaker frame, a speaker having a sound radiating element mounted to the frame for projecting sound in a direction along an axis of said radiating element, a reflector for redirecting sound from the speaker in a wide dispersion pattern comprising a first semi-conical reflector member having an interior surface, having an apex, and having a cone axis extending through said apes, said reflector member having first and second cone element edges spaced from each other about said surface, a second semi-conical reflector member having an exterior surface, having a second apex, and having a second cone axis extending through said second apex, said second reflector member having third and fourth cone element edges spaced from each other about said exterior surface, means for securing said reflector members to each other with said apiece of said reflector members being closely adjacent to one another and said edges all lying in a common plane, means for connecting said reflector to said speaker frame, and a second speaker having a sound radiating element for projecting sound toward said first mentioned speaker in a pattern having a radiating axis aligned with said first mentioned radiation axis, said reflector members each having a second reflecting surface opposite to and congruent with the first mentioned surface of the respective reflector members, said second reflector member being interposed between said second speaker and said first reflector member, and means for connecting said speakers to one another with said reflector members therebetween.

* * * * *